United States Patent [19]
Maekawa

[11] Patent Number: 5,276,365
[45] Date of Patent: Jan. 4, 1994

[54] OUTPUT BUFFER CIRCUIT WITH TWO LEVEL SHIFTS AND BIAS

[75] Inventor: Toshikazu Maekawa, Kanagawa, Japan

[73] Assignee: Sony Corporation, Tokyo, Japan

[21] Appl. No.: 822,950

[22] Filed: Jan. 21, 1992

[30] Foreign Application Priority Data

Jan. 18, 1991 [JP] Japan ................... 3-019568

[51] Int. Cl.$^5$ ................. H03K 19/092; H03K 17/16
[52] U.S. Cl. ................. 307/475; 307/443; 307/296.8
[58] Field of Search ............ 307/475, 443, 296.5, 307/296.8, 451, 452

[56] References Cited

U.S. PATENT DOCUMENTS

| | | | |
|---|---|---|---|
| 4,583,203 | 4/1986 | Monk | 307/475 |
| 4,663,584 | 5/1987 | Okada et al. | 307/296.8 |
| 4,794,283 | 12/1988 | Allen et al. | 307/451 |
| 4,827,159 | 5/1989 | Naganuma | 307/451 |
| 5,013,937 | 5/1991 | Aoki | 307/475 |
| 5,157,281 | 10/1992 | Santin et al. | 307/475 |

Primary Examiner—Edward P. Westin
Assistant Examiner—Richard Roseen
Attorney, Agent, or Firm—Hill, Steadman & Simpson

[57] ABSTRACT

An output buffer circuit is disclosed in which a first signal whose voltage amplitude is smaller than the voltage between zero and the power source voltage VDD and the minimum level is the same as the ground level Gnd and a second signal whose maximum level is the same as the power source voltage VDD but the voltage amplitude is smaller than the voltage between zero and the power source voltage VDD are generated, and it is thereby arranged such that maximum value of the voltages applied between any two terminals of all of the MOS transistors constituting the output buffer circuit becomes |VDD−threshold voltage of MOS transistor|. Therefore, the withstand voltage of devices can be substantially improved. In addition, depending on the first and second signals, the finally output signal can be given the amplitude between the ground level Gnd and the power source voltage VDD.

8 Claims, 2 Drawing Sheets

OUTPUT BUFFER CIRCUIT WITH TWO LEVEL SHIFTS AND BIAS

BACKGROUND OF THE INVENTION

1. Field of the Invention

The present invention relates to an output buffer circuit and, more particularly, to an arrangement for improving the withstand voltage of an output buffer circuit comprising TFTs.

2. Description of the Related Art

Output buffer circuit is used for example as a circuit for outputting a signal generated in a circuit to a circuit in the next stage.

FIG. 3 is a circuit configuration diagram showing an output buffer circuit used in a liquid crystal display of an active matrix type. This circuit is such that address pulses generated in a vertical shift register are output to gate lines 22 through output buffer circuits 21. As shown in FIG. 3, the output buffer circuit 21 is formed of a CMOS transistor having a PMOS transistor mp1 and an NMOS transistor mn1.

Since the transistors forming the pixels are NMOS transistors in the described circuit, the amplitude of the input video signal in general is approximately between 0.5 V and (power source voltage VDD−threshold voltage Vth), i.e., the signal does not have the voltage amplitude between 0 V and the power source voltage VDD. However, the signal voltage output to the gate line 22 is required to have a dynamic range between 0 V and the power source voltage VDD. Therefore, a voltage of the same magnitude as that of the power source voltage PDD is applied between drain and gate, source and gate, and drain and source of the transistors mp1 and mn1 constituting the output buffer circuit 21.

Since the power source voltage PDD in general is as high as 14 to 18 V, if such high voltage is applied to the device directly, the reliability on the device will be impaired. As a measure to solve the problem, it is considered to make the gate oxide film thicker. When the gate oxide film is made thicker, however, such inconveniences are caused that the threshold voltage Vth is increased or the operating speed is lowered (gm is lowered), and in addition, such a problem is encountered that the entire process must be changed.

SUMMARY OF THE INVENTION

The present invention was made in view of the above described problems. Accordingly, it is an object of the present invention to provide an increased withstand voltage of the device without changing the process or sacrificing operating characteristics of the transistor, to thereby enhance reliability on the output buffer circuit.

In order to achieve the above mentioned object, the output buffer circuit of the present invention comprises an NMOS driver circuit for shifting the level of an input signal supplied from the preceding stage to thereby generate a first signal of which the minimum level is clamped to the ground level and the maximum level is held lower than the power source voltage by a predetermined amount of potential, a PMOS driver circuit for shifting the level of the input signal to thereby generate a second signal of which the maximum level is clamped to the power source voltage and the minimum level is held higher than the ground level by the predetermined amount of potential, a bias circuit for generating a first voltage lower than the power source voltage by the predetermined amount of potential and a second voltage higher than the ground level by the predetermined amount of potential, and a CMOS transistor comprising an NMOS transistor of which the source is supplied with the first signal and the gate is supplied with the first voltage and a PMOS transistor of which the source is supplied with the second signal and the gate is supplied with the second voltage.

A first signal of which the minimum level is the same as the ground level but the voltage amplitude is smaller than the voltage between the ground level Gnd and the power source voltage VDD and a second signal of which the maximum level is the same as the power source voltage VDD but the voltage amplitude is smaller than the voltage between the ground level Gnd and the power source voltage VDD similarly to the first signal are generated, and the finally output signal is arranged, depending on the first and second signals, to have its amplitude between the ground level Gnd and the power source voltage VDD. It is thereby achieved that the maximum value of the voltages applied between any two terminals of all of the MOS transistors constituting the output buffer circuit becomes |VDD−threshold voltage of MOS transistor|. Thus, the withstand voltage of the devices can be substantially improved.

BRIEF DESCRIPTION OF THE DRAWINGS

FIG. 2 is a time chart explanatory of operations of various parts in the circuit of FIG. 1; and.

DETAILED DESCRIPTION OF THE PREFERRED EMBODIMENTS

Figure 1:
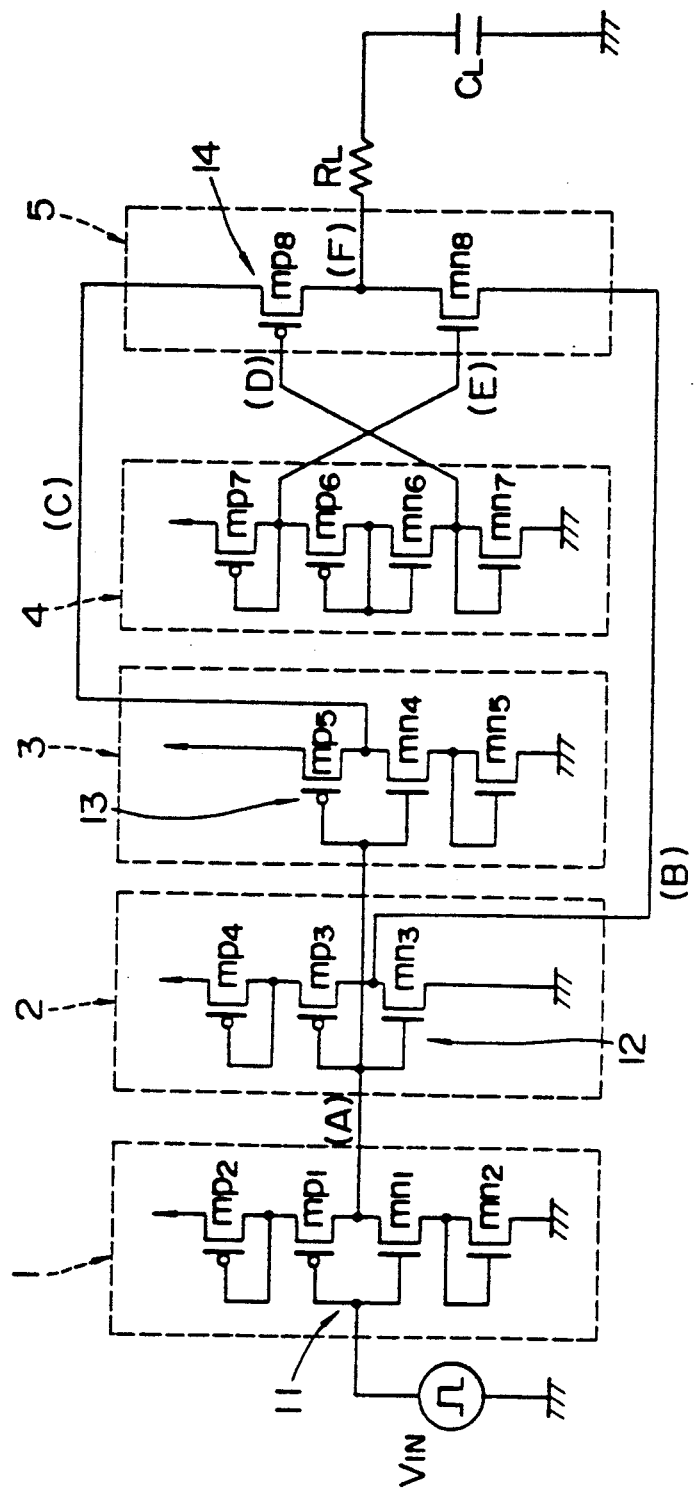
FIG. 1 is a circuit diagram of an output buffer circuit showing an embodiment of the present invention.

FIG. 1 is a circuit configuration diagram of an output buffer circuit showing an embodiment of the present invention.

The output buffer circuit is formed of five blocks of an input circuit 1, an NMOS driver circuit 2, a PMOS driver circuit 3, a bias circuit 4, and an output circuit 5.

The input circuit 1 is provided for generating a signal obtained by suppressing the amplitude of an externally supplied input signal voltage $V_{IN}$. In the present embodiment, the input circuit 1 is constructed of a first CMOS transistor 11, comprising a first PMOS transistor mp1 and a first NMOS transistor mn1, with a second PMOS transistor mp2 connected to its power source side and a second NMOS transistor mn2 connected to its ground side.

The NMOS driver circuit 2 is provided for generating a signal (B) obtained by level shifting the signal (A) supplied from the input circuit 1 so that its minimum level is clamped to the ground level Gnd. This circuit is constructed of a second CMOS transistor 12, comprising a PMOS transistor mp3 and an NMOS transistor mn3, with a PMOS transistor mp4, strapped as diode, connected to its power source side.

The PMOS driver circuit 3 is provided for generating a signal (C) obtained by level shifting the signal (A) supplied from the input circuit 1 to the side of the power source voltage PDD so that its maximum level is clamped to the power source voltage PDD. This circuit is constructed of a third CMOS transistor 13, comprising a PMOS transistor mp5 and an NMOS transistor mn4, with an NMOS transistor mn5, strapped as diode, connected to its ground side.

The bias circuit 4 is constructed of MOS transistors, i.e., PMOS transistors mp6 and mp7 and NMOS transistors mn6 and mn7, each of which is strapped as diode, and these MOS transistors, connected in series, are inserted between the power source and ground. It is arranged such that a voltage (E) is taken out from the midpoint between the PMOS transistors mp6 and mp7 and a voltage (D) is taken out from the midpoint between the NMOS transistors mn6 and mn7.

The output circuit 5 is constructed of a fourth CMOS transistor 14 comprising a PMOS transistor mp8 and an NMOS transistor mn8 and has its output terminal coupled with a resistor RL and a capacitor CL. It is adapted such that the voltages (E) and (D) taken out from the bias circuit 4 are applied to the gates of the NMOS transistor mn8 and the PMOS transistor mp8, respectively.

The operation of the output buffer circuit constructed as described above will be described below with reference to the time chart of FIG. 2.

Figure 2:
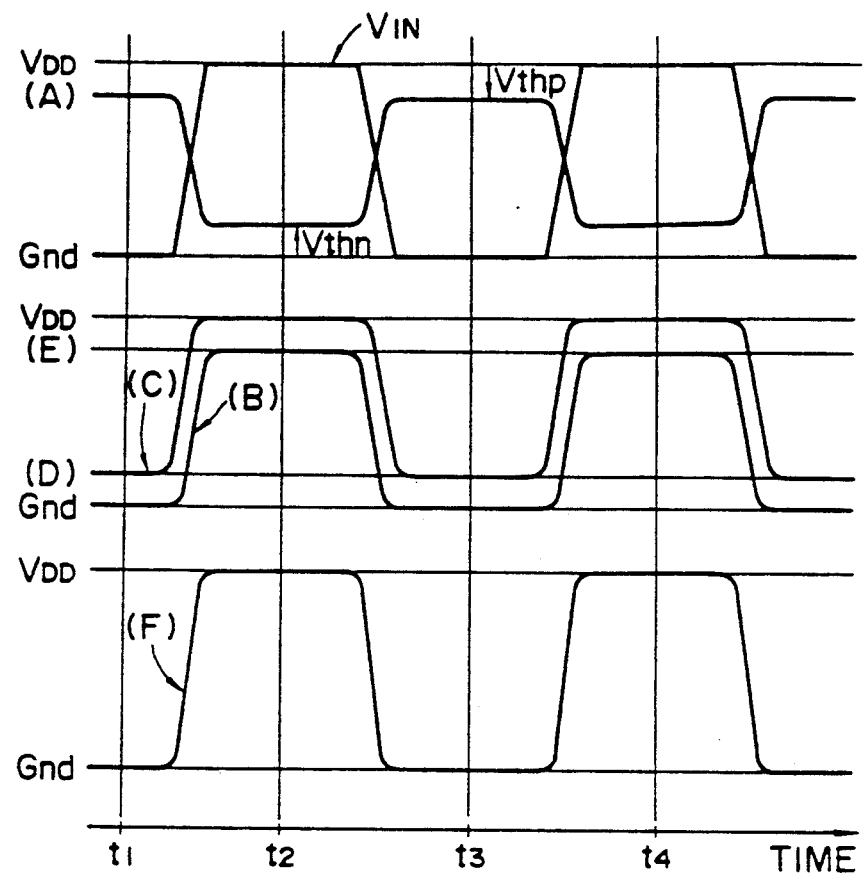
Figure 3:
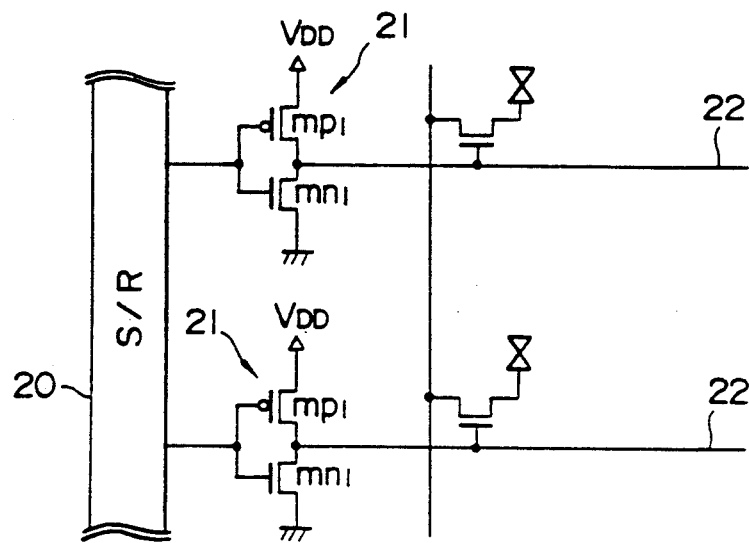
FIG. 3 is a circuit diagram showing an example of use of an output buffer circuit.

First, when an input signal voltage $V_{IN}$ having an amplitude between the ground level and the power source voltage VDD is input to the input circuit 1, it is converted to a signal with a waveform as shown in (A) in FIG. 2. Such waveform (A) is generated by the following circuit operation performed in the input circuit 1.

That is, since the input signal voltage $V_{IN}$ is at "L" at the point of time t1 in FIG. 2, the PMOS transistor mp1 is turned on and the NMOS transistor mn1 is turned off in the first CMOS transistor 11. Thereby, the output signal voltage (A) of the first CMOS transistor 11 is raised toward the power source voltage VDD. However, since the PMOS transistor mp2 strapped as diode is connected to the power source side of the CMOS transistor 11, the maximum potential of the output signal voltage (A) only reaches the level lower than the power source voltage VDD by the threshold voltage Vthp of the PMOS transistor mp2, i.e., it rises only to (VDD−Vthp).

At the point of time t2, since the input signal voltage $V_{IN}$ is at "H", the NMOS transistor mn1 is turned on and the PMOS transistor mp1 is turned off in the first CMOS transistor 11. Thereby, the output signal voltage (A) of the first CMOS transistor 11 is lowered toward the ground potential. However, since the NMOS transistor mn2 strapped as diode is connected to the ground side of the CMOS transistor 11, the minimum potential of the output signal voltage (A) only reaches the level higher than the ground potential by the threshold voltage Vthn of the NMOS transistor mn2. Such phenomena similarly occur at the points of time t3 and t4 and, thus, the output signal voltage (A) whose amplitude is suppressed to be smaller than that of the input signal voltage $V_{IN}$ is obtained from the output terminal of the input circuit 1.

The NMOS driver circuit 2, accepting the signal (A) supplied from the input circuit 1, generates a signal of voltage (B) of the same waveform as that of the signal (A) but having its minimum level clamped to the ground potential and supplies this signal to the output circuit 5.

Meanwhile, the PMOS driver circuit 3 shifts the level of the signal (A) supplied from the input circuit 1 to the power source voltage side to thereby generate a signal (C) whose maximum level is clamped to the power source voltage VDD and supplies this signal to the output circuit 5.

The signal (B) supplied from the NMOS driver circuit 2 is applied to the source of the NMOS transistor mn8, constituting the fourth CMOS transistor 14, and the signal (C) supplied from the PMOS driver circuit 3 is applied to the source of the PMOS transistor mp8. Meanwhile, the gate of the NMOS transistor mn8 is supplied with the bias voltage (E) and the gate of the PMOS transistor mp8 is supplied with the bias voltage (D).

The bias voltage (E) has a value lower than the power source voltage VDD by the threshold voltage Vthp of the PMOS transistor mp2 and the bias voltage (D) has a value higher than the ground potential by the threshold voltage Vthn of the NMOS transistor mn2. Consequently, the PMOS transistor mp8 is turned off at the point of time t1 when the gate voltage and the source voltage becomes the same value.

Meanwhile, the NMOS transistor mn8 is turned on at the point of time t1 because the gate is supplied with the high voltage (E) and the source is supplied with the voltage (B) at the ground level. Consequently, the output signal voltage (F) of the output circuit 5 becomes the ground level Gnd at the point of time t1 when the input signal voltage $V_{IN}$ is at the ground level Gnd, as shown in FIG. 2.

At the point of time t2, while the gate voltage (E) and the source voltage (B) of the NMOS transistor mn8 become the same, the gate of the PMOS transistor mp8 is applied with the voltage (D) at the "L" level and the source of the same is applied with the signal (C) at the VDD level. Consequently, at the point of time t2, the potential of the output signal voltage (F) rises to the level of the power source voltage VDD. The operations of the transistors mp8 and mn8 as described above are rearranged and shown in Table 1.

TABLE 1

| | Input at "L" Level | Input at "H" Level |
|---|---|---|
| VGS of mp8 | VGS = Vthn − Vthn<br>= 0<br>Completely Off | VGS = VDD − Vthn<br>Completely On |
| VGS of mn8 | VGS = (VDD − Vthp) − 0<br>= VDD − Vthp<br>Completely On | VGS = (VDD − Vthp) − (VDD − Vthp)<br>= 0<br>Completely Off |

Since similar operations are performed also at points of time t3 and t4, the amplitude of the output signal (F) becomes the same as that of the input signal voltage $V_{IN}$ (between ground level Gnd and VDD).

In the output buffer circuit of the present embodiment, the maximum value of the voltages applied between any two terminals of the MOS transistors becomes |VDD−Vthn, Vthp| throughout the stages from the input circuit 1 to the output circuit 5. This means that an effect is substantially obtained to increase the withstand voltage of the MOS transistor by the amount corresponding to the threshold value of the MOS transistor.

Further, as shown in the Table 1, the MOS transistors perform CMOS operations at "L" and "H" of the input. Therefore, no D.C. currents flow through them and, hence, the power consumption can be extremely reduced. Although the on-voltage becomes lower than that in an ordinary inverter, it offers no problem when driving such a light load as the gate line.

The transistors mn6, mn7, mp6, and mp7, strapped as diode, forming the bias circuit 4 need not necessarily be of the arrangement as shown in FIG. 1. Provided that they are strapped as diode, the NMOS transistors may be replaced by PMOS transistors and the PMOS transistors may be replaced by NMOS transistors.

In the present invention as described in the foregoing, a first signal of which the voltage amplitude is smaller than the voltage between the ground level Gnd and the power source voltage VDD but the minimum level is the same as the ground level and a second signal of which the voltage amplitude is similarly smaller than the voltage between the ground level Gnd and the power source voltage VDD but the maximum level is the same as the power source voltage VDD are generated, and it is thereby arranged such that the maximum value of the voltages applied between any two terminals of all of the MOS transistors constituting the output buffer circuit becomes |VDD−threshold voltage of MOS transistor| and, in addition, the amplitude of the finally output signal becomes that between the ground level Gnd and the power source voltage VDD. Consequently, it can be achieved to improve in substance the withstand voltage of the devices without decreasing the magnitude of the power source voltage or thickening the gate oxide film. Therefore, high withstand voltage can be attained without changing the process or sacrificing the operating characteristics of transistors and the reliability on the output buffer circuit can be enhanced.

What is claimed is:

1. An output buffer circuit comprising:
    first means for generating a first signal which has two levels based on an input signal which has two levels, the upper level of the first signal being shifted from the upper level of the input signal and the lower levels of said input signal and said first signal being the same;
    second means for generating a second signal which has two levels based on the input signal, the lower level of the second signal being shifted from the lower level of the input signal; and the upper levels of said input signal and said second signal being the same;
    biasing means for providing a first voltage and a second voltage;
    an output stage coupled to the biasing means for generating an output signal according to the first and second signals, said output signal having an amplitude between the ground level and a power source voltage; and wherein said output stage has an output terminal connected to a resistance element and a capacitance element.

2. An output buffer circuit as claimed in claim 1 wherein said lower level of said first signal is ground level and said upper level of said first signal is lower than said power source voltage by a predetermined voltage.

3. An output buffer circuit as claimed in claim 2, wherein said lower level of said second signal is higher than ground level by said predetermined voltage and said upper level of said second signal is the same as said power source voltage.

4. An output buffer circuit as claimed in claim 1, wherein said output stage comprises a first MOSFET transistor and a second MOSFET transistor which are complementary and have their sources and drains connected in series and said first signal connected to said first MOSFET transistor and said second signal connected to said second MOSFET transistor.

5. An output buffer circuit as claimed in claim 4, wherein said first MOSFET transistor has its source connected to said first signal and its gate connected to receive said first voltage, and said second MOSFET transistor has its source connected to second signal and its gate connected to receive said second voltage and the drains of said first and second MOSFET transistors are coupled together and the output signal is supplied from said drains.

6. An output buffer circuit as claimed in claim 1, wherein said biasing means comprises a plurality of MOS transistors having NMOS transistors and PMOS transistors connected in series, each transistor being strapped as diode.

7. An output buffer circuit as claimed in claim 1, wherein said first means comprises a NMOS transistor and a PMOS transistor, and said PMOS transistor is strapped to form a diode and is connected to said power source voltage.

8. An output buffer circuit as claimed in claim 1, wherein said second means comprises a PMOS transistor and an NMOS transistor, and said NMOS transistor is strapped to form a diode and is connected to ground.

* * * * *